(12) United States Patent
Takahashi

(10) Patent No.: US 7,504,729 B2
(45) Date of Patent: Mar. 17, 2009

(54) SEMICONDUCTOR DEVICE WITH EXTRACTION ELECTRODE

(75) Inventor: Hideki Takahashi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 238 days.

(21) Appl. No.: 11/265,097

(22) Filed: Nov. 3, 2005

(65) Prior Publication Data
US 2006/0220180 A1    Oct. 5, 2006

(30) Foreign Application Priority Data
Mar. 2, 2005   (JP) .............................. 2005-057185

(51) Int. Cl.
*H01L 23/48* (2006.01)
(52) U.S. Cl. .................. 257/773; 257/578; 438/106
(58) Field of Classification Search .......... 257/565–796
See application file for complete search history.

(56) References Cited

U.S. PATENT DOCUMENTS

| | | | |
|---|---|---|---|
| 3,474,303 A | 10/1969 | Lutz | |
| 5,539,220 A | 7/1996 | Takahashi | |
| 5,705,848 A | 1/1998 | Bayerer | |
| 6,812,554 B2 * | 11/2004 | Hirashima et al. | 257/673 |
| 7,105,932 B2 * | 9/2006 | Kodani et al. | 257/784 |

FOREIGN PATENT DOCUMENTS

| | | |
|---|---|---|
| DE | 1 514 563 | 6/1969 |
| DE | 101 55 373 | 5/2003 |
| JP | 9-172136 | 6/1997 |
| JP | 2002-043508 | 2/2002 |
| JP | 2004-228461 | 8/2004 |
| JP | 2003-017003 | * 12/2004 |

OTHER PUBLICATIONS

German Office Action for counterpart German application No. 10 2006 005 050.9-33, dated Sep. 18, 2008, and a English Translation thereof.

* cited by examiner

*Primary Examiner*—Zandra V. Smith
*Assistant Examiner*—Paul E Patton
(74) *Attorney, Agent, or Firm*—Buchanan Ingersoll & Rooney PC

(57) ABSTRACT

First and second connection electrodes are formed separately to be opposed to each other on an emitter electrode of an IGBT. Other first and second connection electrodes are formed separately to be opposed to each other on an anode electrode of a diode. A first electrode interconnection part extends from one side portion of an extraction electrode and is bent inwardly. A second electrode interconnection part extends from the other side portion to be opposed to the first electrode interconnection part. The first and second electrode interconnection parts located to face the IGBT are soldered only to the first and second connection electrodes, respectively. Similarly, the first and second electrode interconnection parts located to be opposed to the diode are soldered only to the other first and second connection electrodes, respectively.

6 Claims, 7 Drawing Sheets

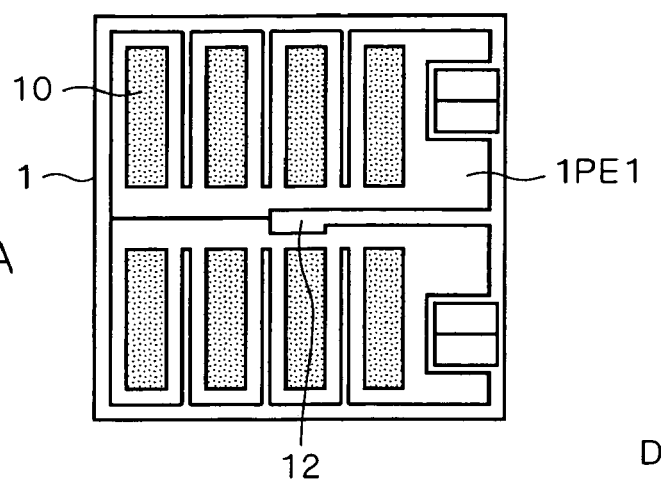
F I G . 5 A
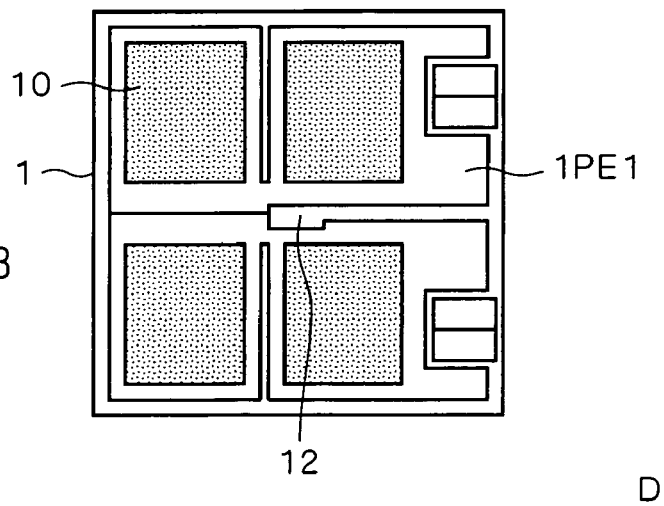
F I G . 5 B
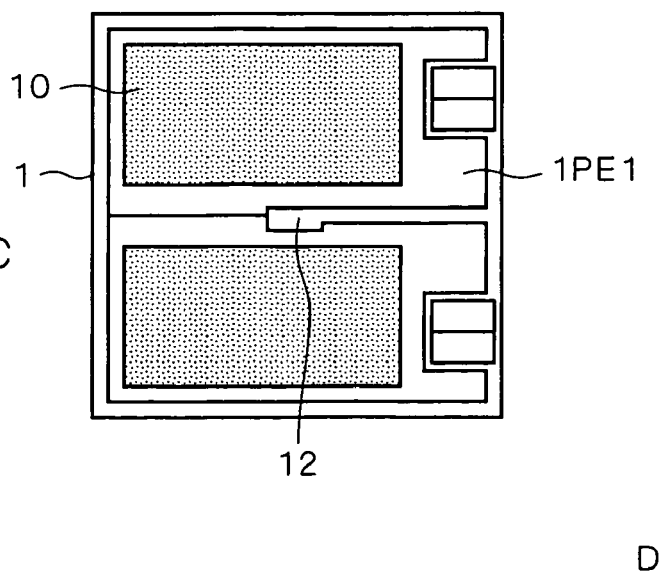
F I G . 5 C

F I G. 7
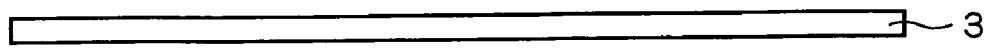
F I G. 8
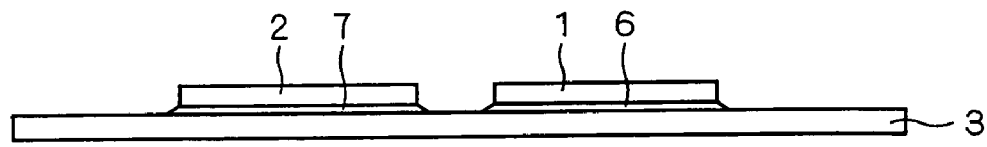
F I G. 9
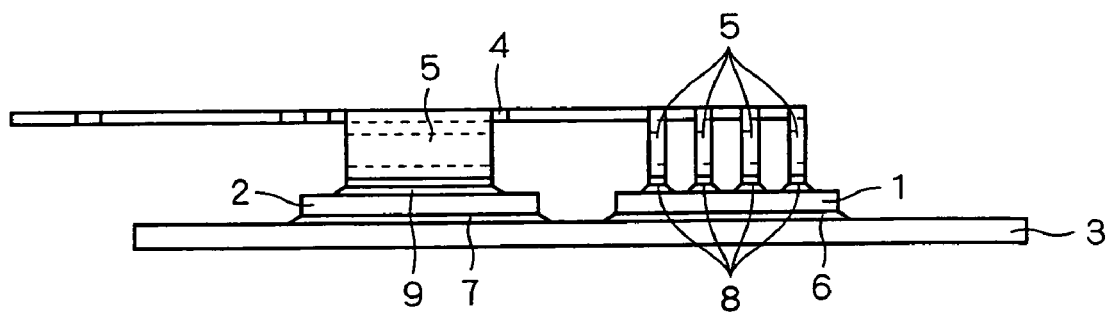

SEMICONDUCTOR DEVICE WITH EXTRACTION ELECTRODE

BACKGROUND OF THE INVENTION

1. Field of the Invention

The present invention relates to interconnection between a power semiconductor element and an electrode for extracting current in the power semiconductor element.

2. Description of the Background Art

In power electronics for driving a motor or the like, an IGBT is characteristically used as a switching device in an area where the rated voltage is 300 V or higher, and a freewheeling diode connected in parallel with the switching device is also used.

An inverter circuit is a dc-ac converter constructed from an IGBT serving as a switching device and a freewheeling diode. The IGBT and freewheeling diode each include 4 or 6 elements for use in motor control. The inverter circuit, having a dc terminal connected to a dc power source, converts a dc voltage to an ac voltage by switching the IGBT, to thereby supply power to a motor which is a load.

In a product of an inverter circuit including six IGBTs and six freewheeling diodes, 6 pairs of one IGBT and one freewheeling diode are arranged on the same substrate. These 6 pairs are formed inside a housing, and this housing has an external collector electrode, an external emitter electrode and an external gate electrode. These external electrodes and each pair of IGBT and freewheeling diode are connected with an aluminum wire. Prior art is disclosed in Japanese Patent application Laid-Open Nos. 9-172136 (1997), 2002-43508 and 2004-228461.

With the development in characteristics of an IGBT and the trend toward shrinkage of the IGBT chip, an IGBT chip these days is half to quarter or smaller in size as compared to that of 10 years ago. On the other hand, since an IGBT and a diode are connected to each other with an aluminum wire in a product of an inverter circuit, the above-described reduction in size of the IGBT chip unavoidably reduces an area of a chip surface region where an aluminum wire should be drawn. However, a problem contradictory to the trend toward smaller chips has recently arisen in that the chip size is determined by the diameter of the aluminum wire since there is a limit imposed on the current value that can be flown through an aluminum wire (that is, the current value is fixed).

Another problem arises in that heat is less likely to escape to the upper portion of a chip since an aluminum wire is connected directly to the chip from above the upper side of the chip.

Further, since the life of heat cycle (H/C) is determined by the area in contact with an aluminum wire, products of recent times have been becoming difficult to satisfy requirements for H/C life expected to have high values.

SUMMARY OF THE INVENTION

An object of the present invention is to provide a semiconductor device capable of preventing the chip size of a power semiconductor element from being determined by the diameter of an aluminum wire, dealing with chip size reduction of the power semiconductor element, and bringing about various manufacturing advantages.

According to the invention, the semiconductor device includes a power semiconductor element, a metal plate, first and second connection electrodes and an extraction electrode. The power semiconductor element includes first and second main electrodes respectively formed on a front surface and a rear surface thereof. The metal plate is electrically connected to the second main electrode of the power semiconductor element. The first and second connection electrodes are formed separately on the first main electrode to be opposed to each other. The extraction electrode includes a first electrode interconnection part formed to extend downwardly from one side portion thereof and a second electrode interconnection part formed separately from the first electrode interconnection part to extend downwardly from the other side portion thereof opposed to the one side portion so as to be opposed to the first electrode interconnection part. The first electrode interconnection part is electrically connected only to the first connection electrode, and the second electrode interconnection part is electrically connected only to the second connection electrode.

A semiconductor device can be obtained which is capable of dealing with chip size reduction of the power semiconductor element.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A, 5B and 5C are plan views schematically illustrating the configuration of a connection electrode of the IGBT according to the first preferred embodiment;

FIGS. 7 to 9 are vertical sectional views each illustrating a manufacturing step of a semiconductor device according to a second preferred embodiment of the invention.

DESCRIPTION OF THE PREFERRED EMBODIMENTS

Preferred embodiment of the present invention including effects and advantages will be described in detail with reference to the accompanied drawings.

First Preferred Embodiment

A first preferred embodiment is characterized by dividing a connection electrode on a surface electrode (first main electrode) of a power semiconductor element in correspondence with division of an extraction interconnect wire (corresponding to an electrode interconnection part which will be described later) and electrically connecting each division of the extraction interconnect wire and a corresponding division of the connection electrode to be opposed to each other. Herein below, with reference to the accompanied drawings, this characteristic will be described specifically with respect to one pair of an IGBT and a diode of an inverter circuit.

Figure 2:
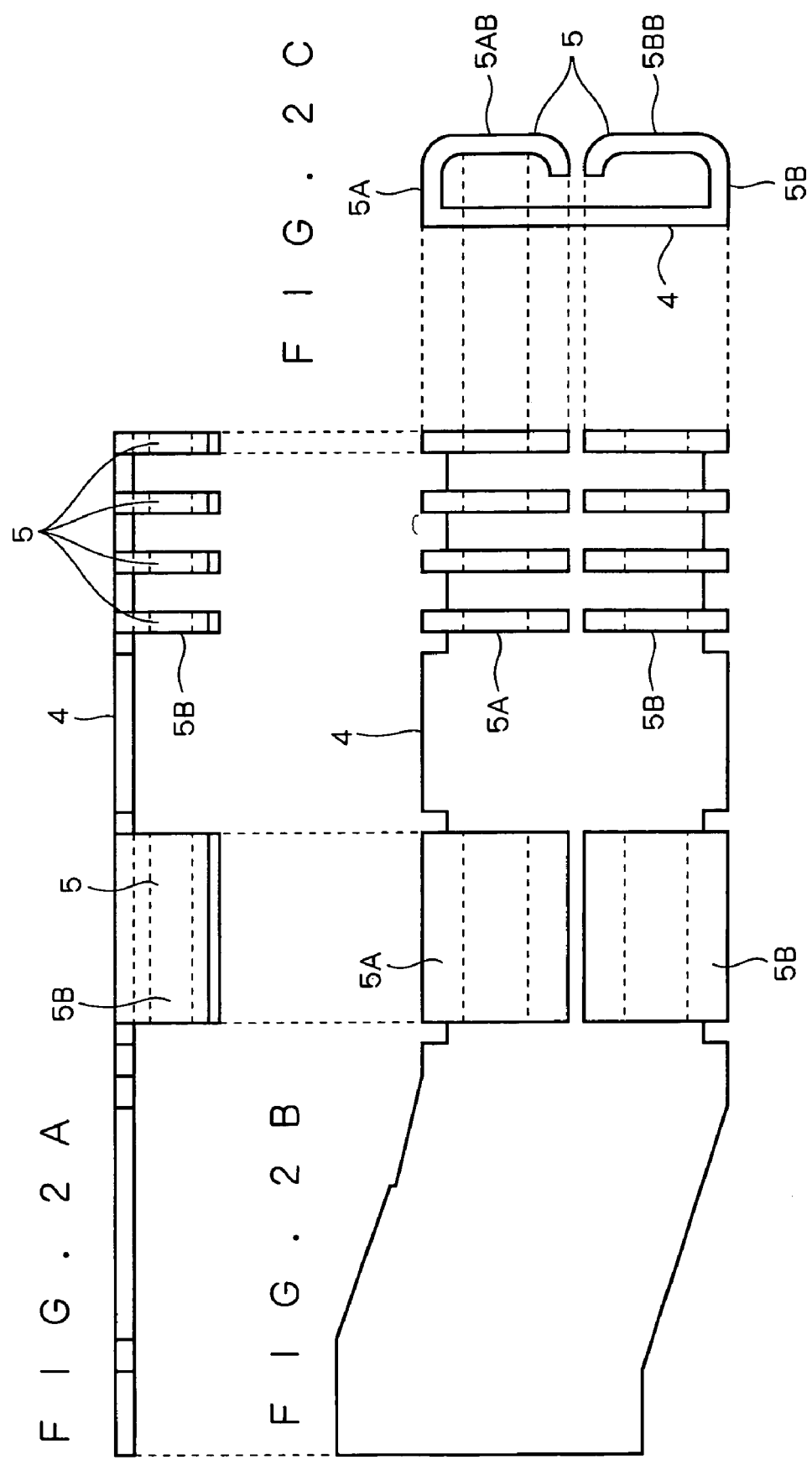
FIGS. 2A, 2B and 2C each illustrate the structure of an extraction electrode according to the first preferred embodiment.
Figure 3:
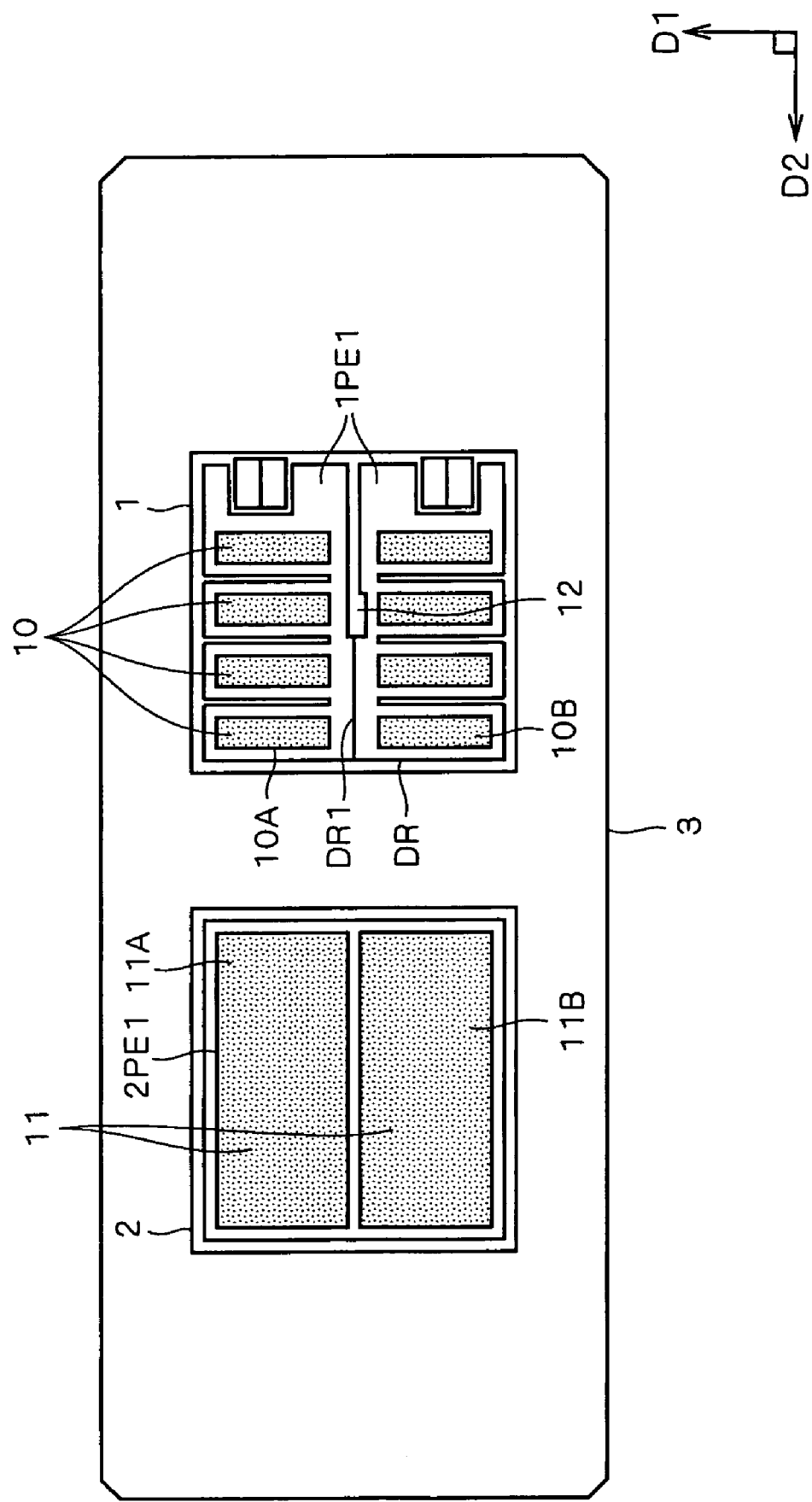
FIG. 3 is a plan view illustrating an IGBT and a freewheeling diode according to the first preferred embodiment mounted on a rear metal plate.
Figure 4:
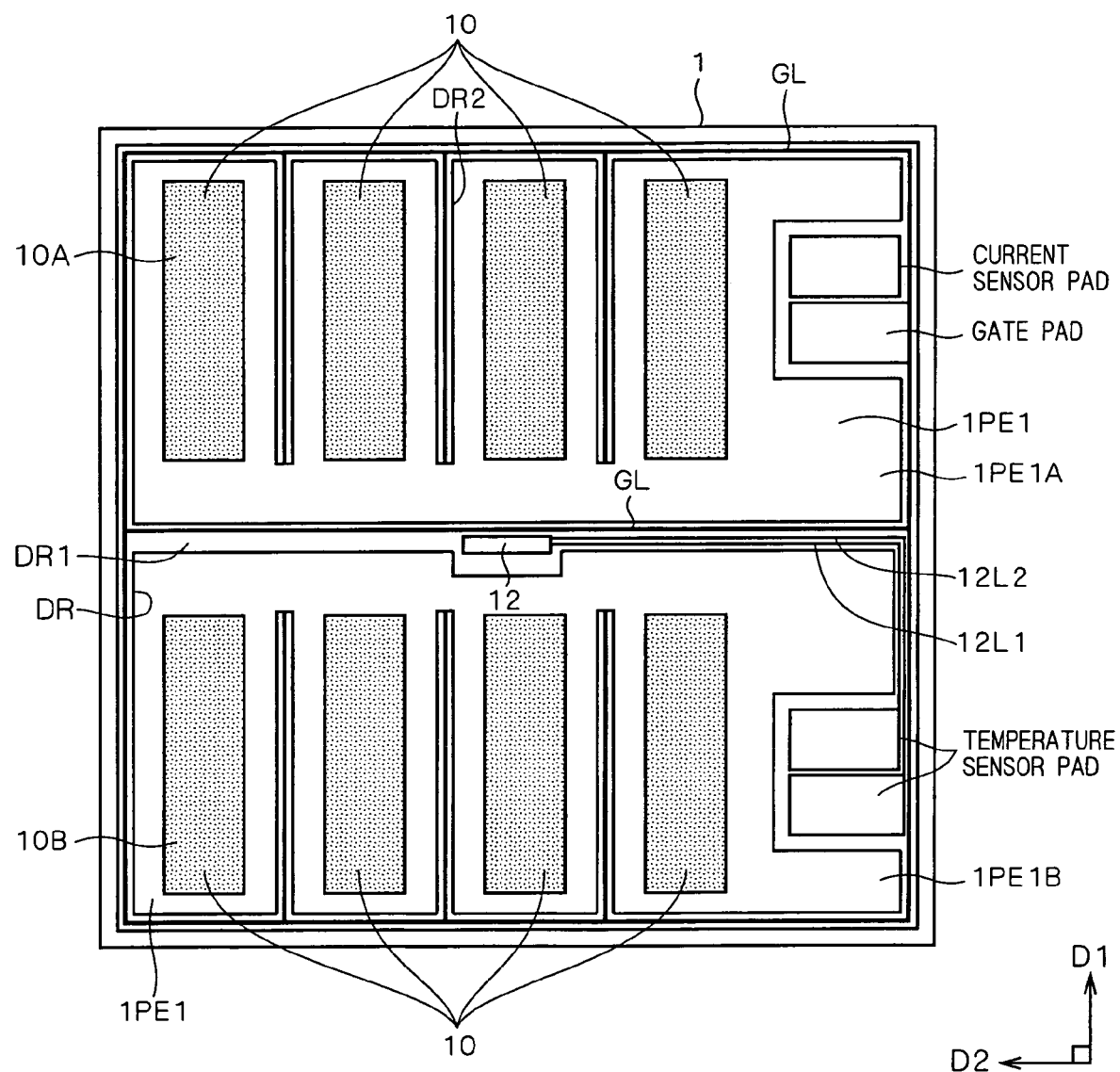
FIG. 4 is a plan view on an enlarged scale illustrating the surface configuration of an IGBT according to the first preferred embodiment.

FIG. 1A is a front view illustrating the structure of a semiconductor device according to one example of the present embodiment, and FIG. 1B is a side view thereof. FIG. 2A is a front view illustrating the structure of an extraction electrode 4 on the upper side. FIG. 2B is a bottom plan view, and FIG. 2C is a side view thereof. FIG. 3 is a top plan view illustrating power semiconductor elements, i.e., an IGBT 1 and a diode 2, mounted on a rear metal plate 3 corresponding to a bottom electrode. In FIGS. 1A, 1B and 3, the reference character D1 denotes a first direction, and the reference character D2 denotes a second direction which is perpendicular to the first direction D1. FIG. 4 is a top plan view on an enlarged scale illustrating the upper surface configuration of the IGBT 1 shown in FIG. 3.

As shown in FIGS. 1A and 1B, a collector electrode (second main electrode) 1PE2 of the IGBT 1 and a cathode electrode (second main electrode) 2PE2 of the diode 2 are electrically connected to the surface of the rear metal plate 3 by solders 6 and 7, respectively.

As shown in FIGS. 3 and 4, similar to a common IGBT, a gate interconnect wire GL connected to a gate pad is formed on the periphery of the surface of the IGBT 1 on which a first main electrode is to be formed, and a dividing region DR is formed on the surface so as to surround the gate interconnect wire GL. The first main electrode is not formed in the dividing region DR. That is, an emitter electrode (first main electrode) 1PE1 is disposed on the surface of the IGBT 1 surrounded by the dividing region DR. Particularly, a dividing region DR1 extending in the second direction D2 in the center of the surface of the IGBT 1 divides the emitter electrode 1PE1B vertically into two in the first direction D1. More specifically, the emitter electrode 1PE1 is divided into an upper emitter electrode 1PE1A and a lower emitter electrode 1PE1B. Further, six dividing regions DR2 of the dividing region DR extending like comb teeth in the first direction D1 are provided to divide the upper emitter electrode 1PE1A into four almost equally in the second direction D2, and the lower emitter electrode 1PE1B into four in the second direction D2. A connection electrode 10 is formed on each of divison of the emitter electrode 1PE1. More specifically, a first connection electrode 1A, i.e., the connection electrode 10 formed on each of division of the upper emitter electrode 1PE1A, is opposed to a corresponding second connection electrode 10B, i.e., the connection electrode 10 formed on each of divisions of the lower emitter electrode 1PE1B, with the dividing region DR1 interposed therebetween. In other words, the first connection electrode 10A and its opposite second connection electrode 10B are both formed to extend in the first direction D1, and are each divided with respect to the second direction D2. These connection electrode 10 are made of metal with Au formed on the uppermost surface similarly to connection electrodes 11 which will be described later, and this structure enables soldering with the connection electrodes 10.

Further, a temperature sensor 12 for monitoring the temperature of an IGBT chip is disposed almost in the center of the dividing region DR1 which divides the emitter electrode 1PE1 into the upper emitter electrode 1PE1A and lower emitter electrode 1PE1B. In FIG. 4, reference characters 12L1 and 12L2 denote an input interconnect wire and an output interconnect wire for the temperature sensor 12, respectively.

In the case where the temperature sensor 12 is not provided, there is no need to provide the dividing region DR1. That is, in such a case, the emitter electrode 1PE1 is not divided vertically into two.

Similarly, as shown in FIG. 3, a first connection electrode 11A and a second connection electrode 11B are formed separately in the first direction D1 to be opposed to each other on an anode electrode (corresponding to the first main electrode) 2PE1 formed on the surface of the diode 2 (for the sake of convenience, the connection electrodes 11A and 11B will hereinafter collectively be referred to as connection electrode 11).

The extraction electrode 4 extends in the second direction D2 and includes electrode interconnection parts 5 divided such that respective divisions are opposed to one another, and is formed unitarily with the electrode interconnection parts 5 from a single metal body. The structure of the extraction electrode 4 will now be described. As clearly shown in FIGS. 1A, 1B and 2A to 2C, a first electrode interconnection part (also referred to as a first extraction interconnect wire) 5A is formed to extend downwardly from one side portion (first side portion) 4SP1 of the extraction electrode 4 extending in the second direction D2, and is bent inwardly so as to have an almost "L" shaped vertical cross-sectional configuration. Further, a second electrode interconnection part (also referred to as a second extraction interconnect wire) 5B is formed to extend downwardly from the other side portion (second side portion) 4SP2 of the extraction electrode 4 opposed to the first side portion 4SP1, and is bent inwardly so as to have a tip portion opposite to the tip portion of the first electrode interconnection part 5A and similarly have an almost "L" shaped vertical cross-sectional configuration. In other words, the extraction electrode 4 includes the first and second electrode interconnection parts 5A and 5B each divided with respect to the second direction D2 to be opposed to each other. Each pair of first and second electrode interconnection parts 5A and 5B opposed to each other and each pair of the first and second connection electrodes 10A and 10B of the IGBT 1 opposed to each other are in opposite relation to each other. In other words, each of four pairs of the first and second electrode interconnection parts 5A and 5B opposed to each other is opposed to a corresponding one of four pairs of the first and second connection electrodes 10A and 10B opposed to each other in terms of the positional relation. Such positional relationship also applies to the diode 2. As shown in FIGS. 1A, 1B and 3, one pair of the first and second electrode interconnection parts 5A and 5B in the extraction electrode 4 intended for connection with the diode 2 is in opposite relation to one pair of the first and second connection electrodes 11A and 11B opposed to each other on the diode 2 side.

In accordance with such division of the electrode interconnection parts 5A and 5B, division of the connection electrodes 10A and 10B (11A, 11B) in correspondence with such division and the above-described opposite relation, the emitter electrode 1PE1 of the IGBT 1 and anode electrode 2PE1 of the diode 2 are electrically connected to the extraction electrode 4 through a junction between the first extraction interconnect wire 5A and first connection electrode 10A (11A) and a junction between the second extraction interconnect wire 5B and second connection electrode 10B (11B) only by soldering the first and second electrode interconnection parts 5A and 5B. More specifically, a bottom 5AB (almost flat) of each of the first electrode interconnection parts 5A is electrically connected only to one of the first connection electrodes 10A (11A) which is opposed to the bottom 5AB, by solder 8 (9), while a bottom 5BB (almost flat) of each of the second electrode interconnection parts 5B is electrically connected only to one of the second connection electrode 10B (11B) which is opposed to the bottom 5BB, by the solder 8 (9). Accordingly, there is no need to provide an aluminum wire for connecting the emitter electrode 1PE1 of the IGBT 1 and the anode electrode 2PE1 of the diode 2.

A semiconductor device formed as described above is then sealed with resin to be one pair of a switching device and a freewheeling diode in an inverter circuit. Through the use of a plurality of such pairs, an inverter circuit as a final product is formed.

First Advantage

In the present embodiment, the connection electrodes 10 and 11 formed on the first main electrode are each divided to be opposed to each other, and the electrode interconnection part 5 of the extraction electrode 4 is also divided to be opposed to each other. In addition, the first connection electrodes 10A, 11A and the corresponding first electrode interconnection part 5A are opposed to each other, and the second connection electrodes 10B and 11B and the corresponding second electrode interconnection part 5B are also opposed to each other. This brings about a manufacturing advantage in that the extraction interconnection part 5 is easily positioned when being soldered to the IGBT 1 and diode 2.

Second Advantage

In the present embodiment, the connection electrodes 10 and 11 are each divided with respect to the second direction D2 so as to be opposed to each other. Thus, there is a manufacturing advantage in that the solders 8 and 9 are easily made uniform in thickness by controlling the amount of solder extracted into each of the connection electrodes 10A, 10B, 11A and 11B. This is because it is more difficult to control solders to have uniform thickness between surfaces as the connection electrodes have larger areas. In other words, a solder pool is more likely to be formed in a larger chip.

The case of forming the IGBT 1 and diode 2 at the same time has been described, however, this advantage is also obtained in the case where either an IGBT or diode is formed.

Third Advantage

Figure 1:
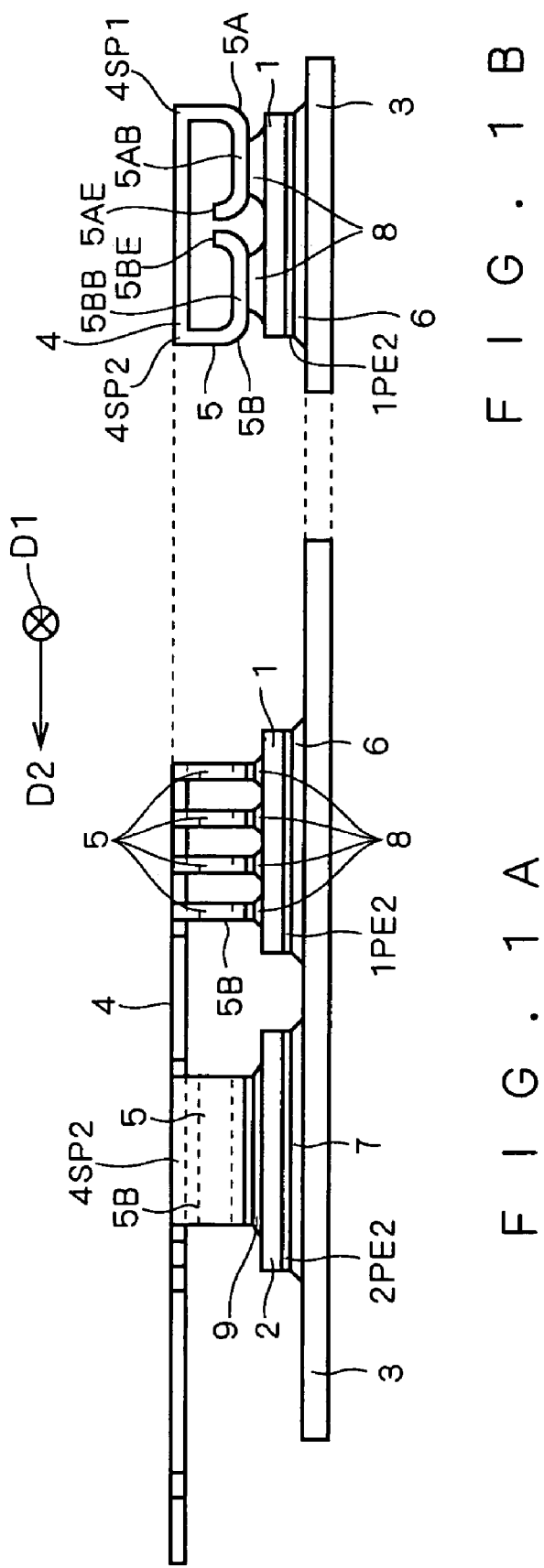
FIGS. 1A and 1B each illustrate the structure of a semiconductor device according to a first preferred embodiment of the present invention.

In the structure shown in FIG. 1, the IGBT 1 and diode 2 are arranged on the rear metal plate 3 in parallel to each other in the second direction D2 as well as in parallel in the second direction D2 in which the extraction electrode 4 positioned above the IGBT 1 and diode 2 extends, and each of the electrode interconnection parts 5 (5A, 5B) is formed to extend from a section of the extraction electrode 4 corresponding to the upper portion of the IGBT 1 and a section of the extraction electrode 4 corresponding to the upper portion of the diode 2, and is bent inwardly. Further, the extraction electrode 4 and electrode interconnection parts 5 (5A, 5B) are formed unitarily. The use of such extraction electrode 4 allows an upper lead frame including the extraction electrode 4 and electrode interconnection parts 5 to be electrically connected to the divisions of the connection electrode 10 of the IGBT 1 and the divisions of the connection electrode 111 of the diode 2 by one step (soldering of the electrode interconnection part 5 and connection electrodes 10, 11 opposed to each other). In this respect, formation of the upper lead frame is easier than in the case of individually forming a connection terminal of an IGBT and that of a diode.

Fourth Advantage

As already described, the temperature sensor 12 is provided in the dividing region DR1 extending in parallel to the extraction electrode 4 located above the IGBT 1. Accordingly, the temperature of the IGBT chip except its periphery can be monitored. Particularly, the temperature sensor 12 is provided in the center of the surface of the IGBT 1, i.e., in the central portion of the dividing region DR1, and can therefore monitor the temperature in the center of the IGBT chip where the heat is greatest.

As shown in FIGS. 1A, 1B and 4, the IGBT 1 has the dividing region DR1 extending in parallel to the extraction electrode 4 and extraction interconnection parts 5. Therefore, as shown in FIGS. 5A to 5C, the temperature sensor 12 can be arranged in the center of the IGBT chip regardless of the number of divisions of the emitter electrode 1PE1 or connection electrode 10 in the second direction D2 (lateral direction).

Figure 6A:
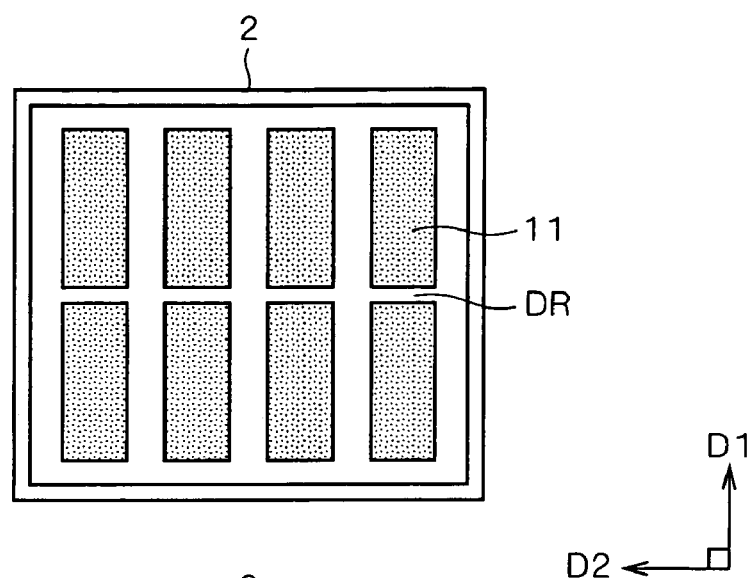
FIGS. 6A, 6B and 6C are plan views schematically illustrating the configuration of a connection electrode of the diode according to the first preferred embodiment.
Figure 6B:
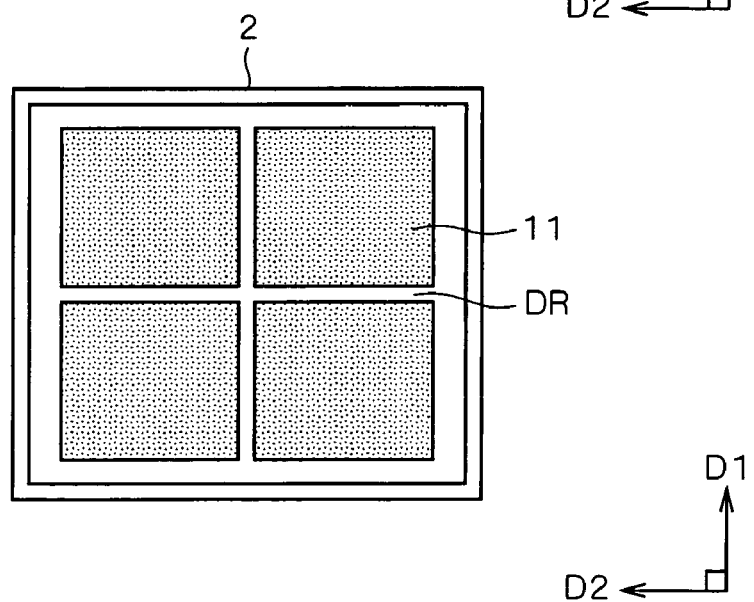
Figure 6C:
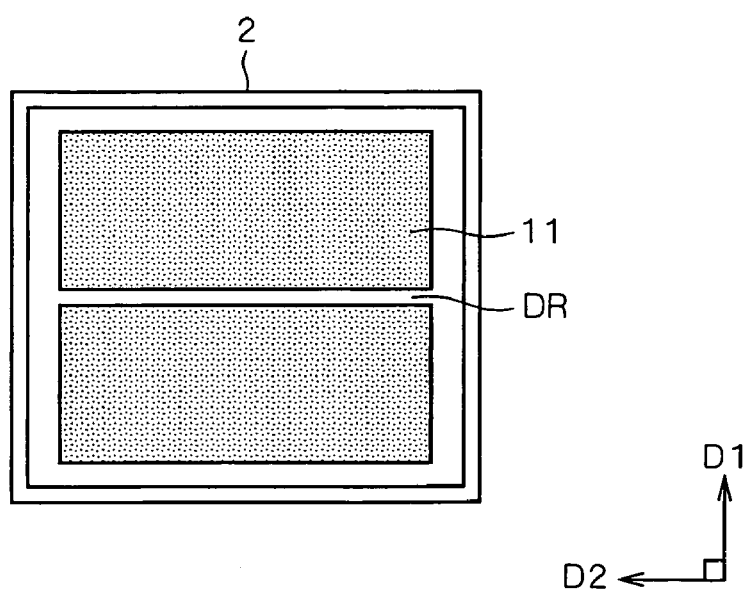

FIGS. 6A to 6C are top plan views illustrating various cases of diode 2. Similarly to the IGBT 1 illustrated in FIG. 4, the dividing region DR extending in parallel to the extraction electrode 4 may be disposed in the central portion of the diode chip surface in the first direction D1, and a temperature sensor may be disposed in the central portion of the dividing region DR, i.e., in the center of the diode chip surface. In such case, the temperature in the center of the diode chip can also be monitored.

Second Preferred Embodiment

The present embodiment relates to a method of manufacturing the semiconductor device illustrated in FIG. 1. FIGS. 7 to 9 are vertical sectional views each illustrating a manufacturing step of the semiconductor device illustrated in FIG. 1.

First, in the step shown in FIG. 7, the metal plate 3 to be a rear electrode is prepared.

Next, in the step shown in FIG. 8, the IGBT 1 and diode 2, each having electrodes on front and rear surfaces and each having first and second connection electrodes formed separately on the surface to be opposed to each other are soldered to the surface of the rear metal plate 3 by the solders 6 and 7, respectively. The first and second connection electrodes are formed by depositing Au-containing metal on the uppermost surface or plating when the IGBT 1 and diode 2 are in the state of wafer.

Next, in the step shown in FIG. 9, upon locating the extraction electrode 4 above the IGBT 1 and diode 2 such that the bottoms (cf. 5AB, 5BB shown in FIG. 1) of the opposed and separated respective electrode interconnection parts of the extraction electrode 4 which have been formed unitarily in advance are opposed to the connection electrodes corresponding to the electrode interconnection parts (i.e., executing positioning of the extraction electrode 4), the electrode interconnection parts are soldered to the corresponding connection electrodes by the solders 8 and 9. Accordingly, the extraction electrode 4 is electrically connected to the IGBT 1 and diode 2.

Thereafter, the semiconductor device manufactured as described above is sealed with resin, and is constructed as a final product.

Note

The concept of "power semiconductor element" adopted in the present invention includes a switching device such as a power MOSFET and a diode in addition to the IGBT illustrated in the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a power semiconductor element comprising first and second main electrodes respectively formed on a front surface and a rear surface thereof;
   a metal plate electrically connected to said second main electrode of said power semiconductor element;

first and second connection electrodes formed separately on said first main electrode to be opposed to each other; and an extraction electrode comprising a first electrode interconnection part formed to extend downwardly from one side portion of said extraction electrode, and a second electrode interconnection part separted from said first electrode interconnection part and formed to extend downwardly from another side portion of said extraction electrode opposed to said one side portion so as to be separated from and opposed to said first electrode interconnection part, wherein said first electrode interconnection part is electrically connected only to said first connection electrode, and said second electrode interconnection part is electrically connected only to said second connection electrode.

2. The semiconductor device according to claim 1, wherein said first and second connection electrodes both extend in a first direction, said extraction electrode extends in a second direction being perpendicular to said first direction, and said first and second connection electrodes are each divided in said second direction.

3. The semiconductor device according to claim 2, wherein said first and second electrode interconnection parts are both bent inwardly and are opposed to each other.

4. The semiconductor device according to claim 2, wherein said first main electrode is divided into two in a region between said first and second connection electrodes, and a dividing region in which said first main electrode is not present is formed on said front surface of said power semiconductor element between said first and second connection electrodes, and a temperature sensor configured to monitor a temperature of said power semiconductor element is formed on said dividing region.

5. The semiconductor device according to claim 4, wherein said temperature sensor is provided in a central portion of said front surface of said power semiconductor element.

6. A method of manufacturing a semiconductor device comprising the steps of:

by using a power semiconductor element comprising a first main electrode including thereon first and second connection electrodes formed separately to be opposed to each other and a second main electrode opposed to said first main electrode, electrically connecting said second main electrode to a surface of a metal plate; and by using an extraction electrode comprising a first electrode interconnection part extending downwardly from one side portion of said extraction electrode and a second electrode interconnection part extending downwardly from another side portion of said extraction electrode opposed to said one side portion and being separated from said first electrode interconnection part to be opposed to said first electrode interconnection part, electrically connecting said first electrode interconnection part only to said first connection electrode and electrically connecting said second electrode interconnection part only to said second connection electrode.

* * * * *